(12) United States Patent
Chou et al.

(10) Patent No.: US 11,450,667 B2
(45) Date of Patent: Sep. 20, 2022

(54) SEMICONDUCTOR DEVICE FOR INCREASING CAPACITANCE EFFECTIVE AREA AND EFFECTIVE CAPACITANCE VALUE

(71) Applicant: Raydium Semiconductor Corporation, Hsinchu (TW)

(72) Inventors: Kuan-Hung Chou, Kaohsiung (TW); Po-Chang Jen, Taoyuan (TW); Ming-Heng Tsai, Hsinchu (TW)

(73) Assignee: Raydium Semiconductor Corporation, Hsinchu County (TW)

( * ) Notice: Subject to any disclaimer, the term of this patent is extended or adjusted under 35 U.S.C. 154(b) by 100 days.

(21) Appl. No.: 16/567,392

(22) Filed: Sep. 11, 2019

(65) Prior Publication Data

US 2020/0091153 A1 Mar. 19, 2020

(30) Foreign Application Priority Data

Sep. 14, 2018 (TW) ................. 107132522

(51) Int. Cl.
*H01L 27/092* (2006.01)
*H01L 21/02* (2006.01)
*H01L 23/532* (2006.01)

(52) U.S. Cl.
CPC ...... *H01L 27/0928* (2013.01); *H01L 21/0223* (2013.01); *H01L 23/53271* (2013.01)

(58) Field of Classification Search
CPC ..... H01L 21/02; H01L 27/092; H01L 23/532; H01L 27/0928; H01L 21/0223; H01L 23/53271

USPC .......................................................... 257/371
See application file for complete search history.

(56) References Cited

U.S. PATENT DOCUMENTS

| | | | | |
|---|---|---|---|---|
| 5,043,778 A | * | 8/1991 | Teng .................. | H01L 29/0653 257/374 |
| 6,448,611 B1 | * | 9/2002 | Oh ........................ | H01L 29/402 257/340 |
| 2001/0028577 A1 | * | 10/2001 | Sung ..................... | H01L 27/115 365/185.18 |
| 2002/0175373 A1 | * | 11/2002 | Utsunomiya ....... | H01L 27/1203 257/347 |
| 2003/0214864 A1 | * | 11/2003 | Lee .................. | H01L 29/42324 365/200 |
| 2003/0227047 A1 | * | 12/2003 | Hsu ....................... | H01L 27/115 257/314 |
| 2006/0226499 A1 | * | 10/2006 | Shimizu ............ | H01L 29/66568 257/409 |
| 2007/0093024 A1 | * | 4/2007 | Fu ....................... | H01L 29/7886 438/257 |

(Continued)

*Primary Examiner* — Sheng-Bai Zhu (57) ABSTRACT

A semiconductor device is disclosed. The semiconductor device includes a substrate, a well, an oxidation layer, a gate electrode and a shared source/drain electrode. The substrate has a first surface and a second surface opposite to each other. The well is formed in the substrate. The substrate and the well have a first conductivity type and a second conductivity type respectively. The oxidation layer is formed in the well. The gate electrode is formed above the first surface and has a first opening. The shared source/drain electrode is formed near the first surface in the oxidation layer and exposed from the first opening. The shared source/drain electrode has the first conductivity type.

7 Claims, 7 Drawing Sheets

(56) References Cited

U.S. PATENT DOCUMENTS

| | | | | |
|---|---|---|---|---|
| 2013/0105898 A1* | 5/2013 | Wang | ................ | H01L 29/66477 257/352 |
| 2016/0148944 A1* | 5/2016 | Yu | ..................... | H01L 27/11521 438/258 |
| 2016/0163876 A1* | 6/2016 | Wu | ................... | H01L 29/42328 257/320 |

* cited by examiner

SEMICONDUCTOR DEVICE FOR INCREASING CAPACITANCE EFFECTIVE AREA AND EFFECTIVE CAPACITANCE VALUE

BACKGROUND OF THE INVENTION

1. Field of the Invention

The invention relates to a semiconductor device; in particular, to a semiconductor device capable of increasing the capacitance effective area and the effective capacitance value with the same overall area.

2. Description of the Prior Art

Figure 1:
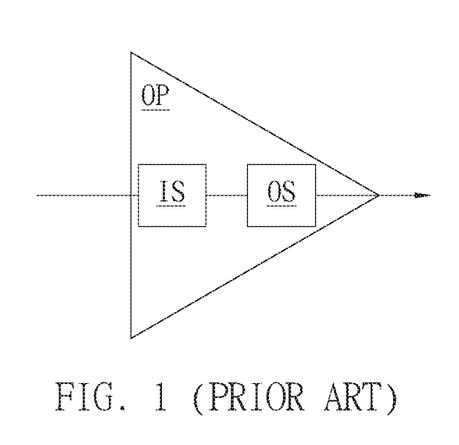
FIG. 1 illustrates a timing diagram of the display data signal and the polarity control signal in the prior art.

In general, a source driver in a display device typically employs an operational amplifier OP as shown in FIG. 1 to drive a RC loading of the liquid crystal display panel.

Figure 2:
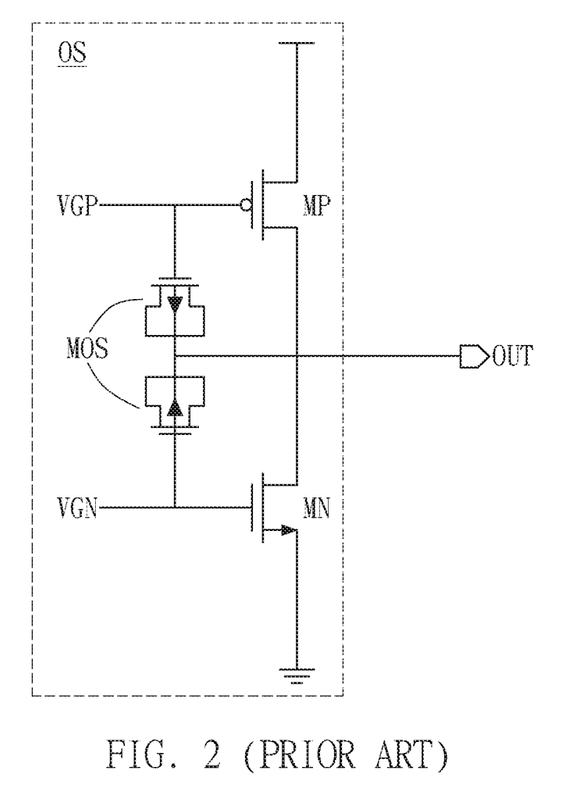
FIG. 2 illustrates a schematic diagram showing the output stage of a conventional operational amplifier with a gold-oxygen half-capacitance as a compensation capacitor.

The operational amplifier OP may include an input stage IS and an output stage OS that are connected in series with each other. In order to maintain the stability of the system, the output stage OS of the operational amplifier OP usually needs to be provided with a compensation capacitor. For example, the output stage OS in FIG. 2 uses a metal-oxide-semiconductor (MOS) capacitor MOS as a compensation capacitor.

Figure 3A:
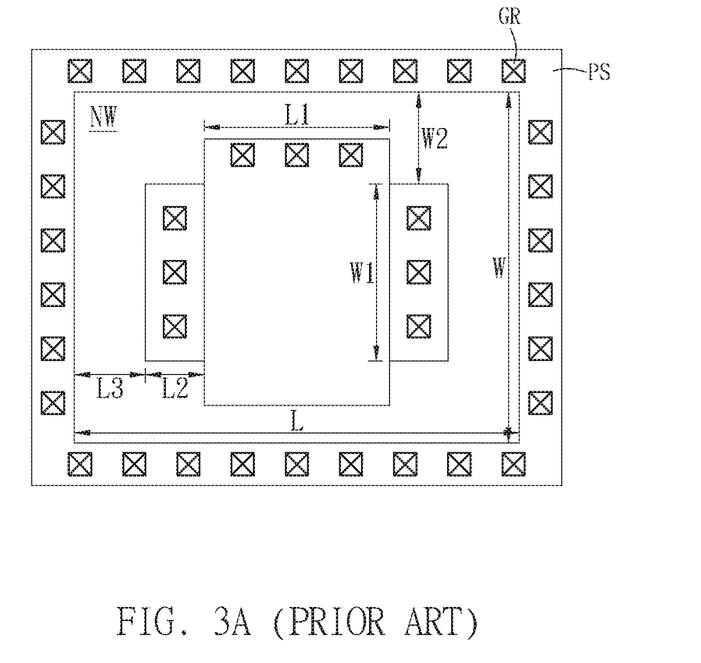
FIG. 3A and FIG. 3B respectively illustrate a top view showing a layout of a conventional MOS capacitor and a cross-sectional view showing its luminated structure.
Figure 3B:
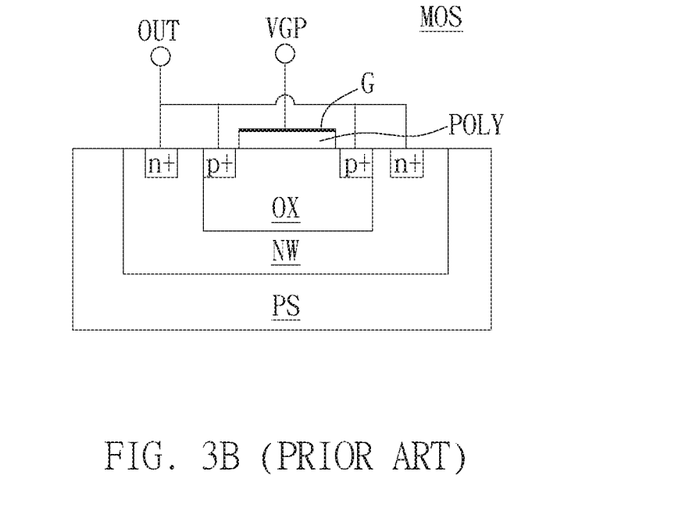

As shown in FIG. 3A and FIG. 3B, in the layout of the metal-oxide-semiconductor capacitor MOS in the general operational amplifier OP, the P-type substrate PS needs to have a guard ring GR of the N-type well NW. In the layout design, in addition to considering the N-well NW can meet the design rule check (DRC), it is also necessary to consider the capacitance characteristic of the effective area of the metal-oxide-semiconductor capacitor (for example, the product of the effective width and the effective length). Therefore, the value of the compensation capacitor actually provided by the metal-oxide-semiconductor capacitor as the compensation capacitor is not high, which leads to poor stability of the system and needs to be overcome.

SUMMARY OF THE INVENTION

Therefore, the invention provides a semiconductor device capable of increasing the capacitance effective area and the effective capacitance value with the same overall area to solve the above-mentioned problems occurred in the prior arts.

An embodiment of the invention is a semiconductor device. In this embodiment, the semiconductor device includes a substrate, a well, an oxidation layer, a gate electrode and a shared source/drain electrode. The substrate has a first surface and a second surface opposite to each other. The well is formed in the substrate. The substrate and the well have a first conductivity type and a second conductivity type respectively. The oxidation layer is formed in the well. The gate electrode is formed above the first surface and has a first opening. The shared source/drain electrode is formed near the first surface in the oxidation layer and exposed from the first opening. The shared source/drain electrode has the first conductivity type.

In an embodiment, the first conductivity type is P-type and the second conductivity type is N-type.

In an embodiment, a guard ring surrounding the well is formed in the substrate.

In an embodiment, the semiconductor device further includes a first contact and a second contact. The first contact is electrically connected to the gate electrode. The second contact is electrically connected to the shared source/drain electrode.

In an embodiment, the semiconductor device further includes a poly-silicon layer formed above the first surface and under the gate electrode.

In an embodiment, an area of the poly-silicon layer is larger than an area of the gate electrode.

In an embodiment, the poly-silicon layer has a second opening under the first opening and the second opening is larger than the first opening.

In an embodiment, the substrate having the first conductivity type and the shared source/drain electrode both comprise dopants of the first conductivity type.

In an embodiment, a concentration of the dopants of the first conductivity type in the shared source/drain electrode is higher than that in the substrate.

In an embodiment, the well having the second conductivity type comprises dopants of the second conductivity type.

Compared to the prior art, the semiconductor device according to the invention can be a MOS capacitor applied to an operational amplifier, which can increase capacitance effective area and effective capacitance value by increasing the area of the poly-silicon layer and using the shared source/drain electrode under the condition of the same overall area. Therefore, higher compensation capacitance value can be provided to improve the stability of the system, thereby improving the disadvantage of the system which is not stable due to the low actual compensation capacitance value in the prior art.

The advantage and spirit of the invention may be understood by the following detailed descriptions together with the appended drawings.

BRIEF DESCRIPTION OF THE APPENDED DRAWINGS

FIG. 1 illustrates a schematic diagram showing a conventional operational amplifier including an input stage and an output stage coupled in series with each other.

DETAILED DESCRIPTION OF THE INVENTION

An embodiment of the invention is a semiconductor device.

In this embodiment, the semiconductor device according to the invention can be a MOS capacitor applied to an operational amplifier. Its main function is to provide higher compensation capacitance value to improve the stability of the system, thereby improving the disadvantage of the system which is not stable due to the low actual compensation capacitance value in the prior art.

Figure 4A:
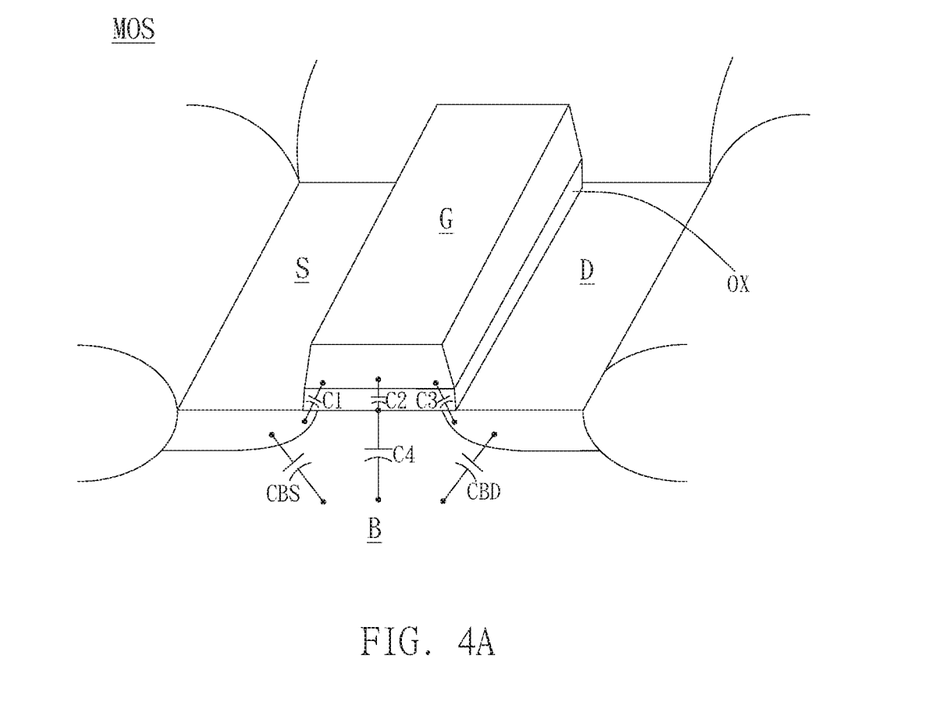
FIG. 4A and FIG. 4B illustrate schematic diagrams showing respective internal distributed capacitances in a general MOS capacitor.
Figure 4B:
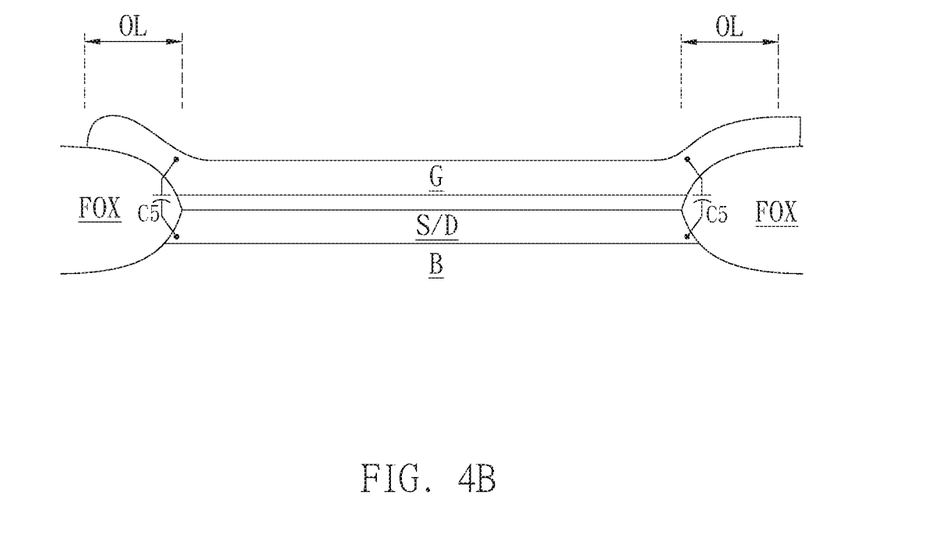

At first, please refer to FIG. 4A and FIG. 4B. FIG. 4A and FIG. 4B illustrate schematic diagrams showing respective internal distributed capacitances in a general MOS capacitor.

As shown in FIG. 4A and FIG. 4B, the MOS capacitor MOS formed on the substrate B includes a gate electrode G, a source electrode S, and a drain electrode D. The internal distributed capacitors in the MOS capacitor MOS can include a first capacitor C1 between the gate electrode G and the source electrode S, a second capacitor C2 between the gate electrode G and the oxide layer OX, a third capacitor C3 between the gate electrode G and the drain electrode D, a fourth capacitor C4 between the oxide layer OX and the substrate B, a fifth capacitor C5 between the gate electrode G and the substrate B located in an overlap region OL that the gate electrode G at a side and a field oxide layer FOX overlap, a capacitor CBS between the source electrode S and the substrate B and a capacitor CBD between the drain electrode D and the substrate B.

Figure 5:
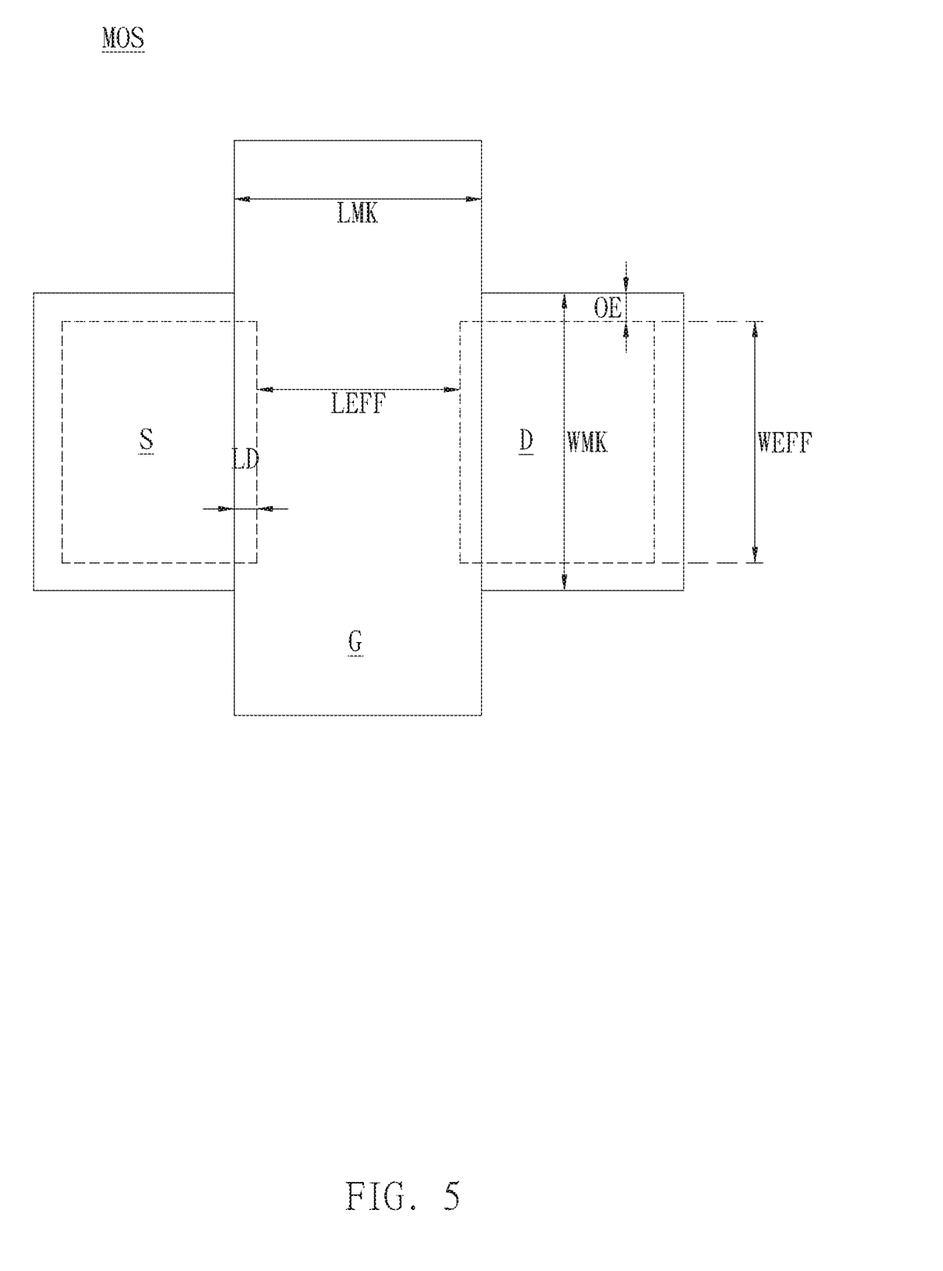
FIG. 5 illustrates a schematic diagram showing the definition of parameters such as an effective width and an effective length in a general MOS capacitor.

Then, please refer to FIG. 5. FIG. 5 illustrates a schematic diagram showing the definition of parameters such as an effective width and an effective length in a general MOS capacitor.

As shown in FIG. 5, in the MOS capacitor MOS, the actual effective length LEFF of the gate electrode G is the distance between the source electrode S and the drain electrode D. Since both the source electrode S and the drain electrode D extend to below the gate electrode G, there is a small overlap length LD with the gate G. Therefore, the effective length LEFF of the gate electrode G is slightly smaller than the mask length LMK and the effective length LEFF is approximately equal to the mask length LMK minus twice the overlap length LD, but not limited to this.

Similarly, the mask width WMK of the source electrode S and the drain electrode D is also slightly reduced to the effective width WEFF due to the disposition of the field oxide layer; that is to say, the effective width WEFF of the source electrode S and the drain electrode D is slightly smaller than the mask width WMK. And, the effective width WEFF will be approximately equal to the mask width WMK minus twice the width OE, but not limited to this.

Figure 6A:
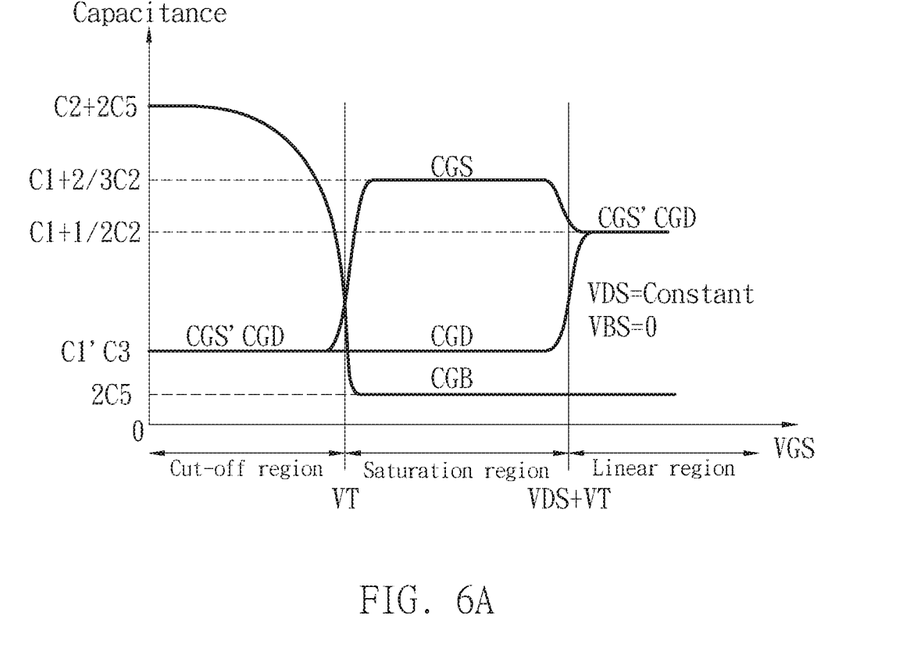
FIG. 6A and FIG. 6B illustrate schematic diagrams showing changes in the capacitance values of the MOS capacitor at different gate-source voltages respectively.
Figure 6B:
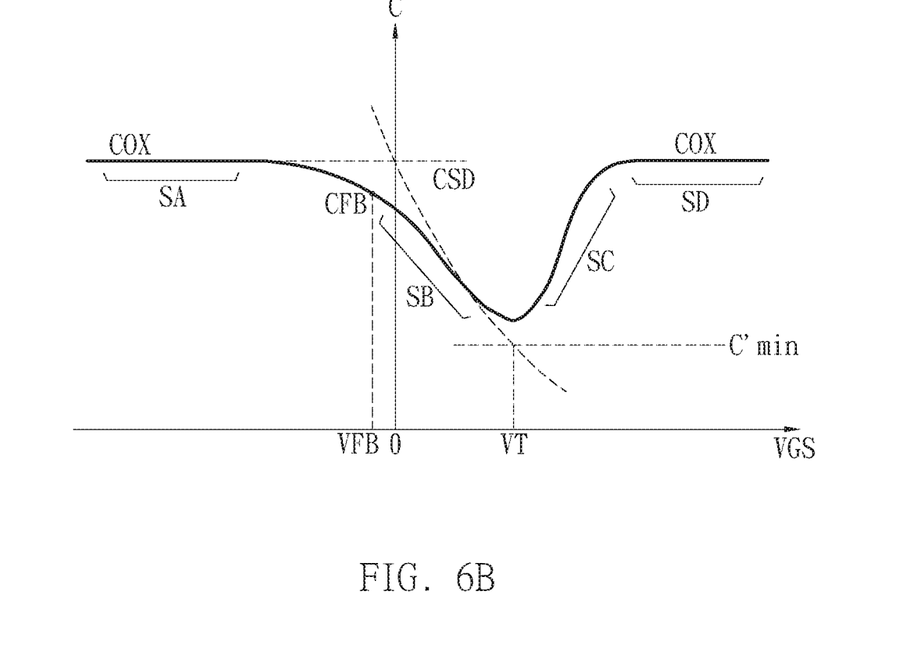

Next, please refer to FIG. 6A and FIG. 6B. FIG. 6A and FIG. 6B illustrate schematic diagrams showing changes in the capacitance values of the MOS capacitor at different gate-source voltages respectively.

As shown in FIG. 6A, when the gate-source voltage VGS of the MOS capacitor is between 0 and the threshold voltage VT, it is defined as "a cut-off region"; when the gate-source voltage VGS of the MOS capacitor is between the threshold voltage VT and (the drain-source voltage VDS plus the threshold voltage VT), it is defined as "a saturation region"; when the gate-source voltage VGS of the MOS capacitor is higher than (the drain-source voltage VDS plus the threshold voltage VT), it is defined as "a linear region". FIG. 6B illustrates a schematic diagram showing the capacitance of the MOS capacitor is at "an aggregation stage SA", "a depletion stage SB", "a moderate inversion stage SC" and "a strong inversion stage SD" under different gate-source voltages VGS.

In summary, the first capacitor C1 to the fifth capacitor C5 can be respectively calculated as follows:

(1) The capacitance of the first capacitor C1 between the gate electrode G and the source electrode S
=the capacitance of the third capacitor C3 between the gate electrode G and the drain electrode D
=(the overlap length LD)*(the effective width WEFF)*(the oxide layer capacitance COX)

(2) The capacitance of the second capacitor C2 between the gate electrode G and the oxide layer OX
=(the effective width WEFF)*(the effective length LEFF)*(the oxide layer capacitance COX)
=(the effective width WEFF)*(the mask length LMK−2*the overlap length LD)*(the oxide layer capacitance COX)

(3) The capacitance of the fourth capacitor C4 between the oxide layer OX and the substrate B=0

(4) The capacitance of the fifth capacitor C5 between the gate electrode G and the substrate B
=(the capacitance CGB between the gate electrode G and the substrate B)*(the effective length LEFF)
=(the capacitance CGB between the gate electrode G and the substrate B)*(the mask length LMK−2* the overlap length LD)

Next, assuming that the capacitance values of the MOS capacitors in "the cut-off region", "the saturation region" and "the linear region" are COFF, CSAT, and CLINE respectively. And then, COFF, CSAT, and CLINE can be calculated as follows:

(1) COFF
=(the capacitance CGB between the gate electrode G and the substrate B)+(the capacitance CGS between the gate electrode G and the source electrode S)+(the capacitance CGD between the gate electrode G and the drain electrode D)

$$=(C2+2*C5)+(C1)+(C3) \quad \text{Formula 1}$$

(2) CSAT
=(the capacitance CGB between the gate electrode G and the substrate B)+(the capacitance CGS between the gate electrode G and the source electrode S)+(the capacitance CGD between the gate electrode G and the drain electrode D)

$$=(2*C5)+(C1+2C\tfrac{2}{3})+(C3) \quad \text{Formula 2}$$

(3) CLINE
=(the capacitance CGB between the gate electrode G and the substrate B)+(the capacitance CGS between the gate electrode G and the source electrode S)+(the capacitance CGD between the gate electrode G and the drain electrode D)

$$=(2*C5)+(C1+C2/2)+(C3+C2/2) \quad \text{Formula 3}$$

It can be known from the above formula 1 to formula 3 that if the capacitance of the second capacitor C2 between the gate electrode G and the oxide layer OX can be effectively increased, the MOS capacitor can provide higher capacitance value no matter in "the cut-off region", "the saturation region" and "the linear region". Therefore, when the MOS capacitor is applied to an operational amplifier, the MOS capacitor can provide higher compensation capacitance value to improve the overall stability of the system.

Figure 7:
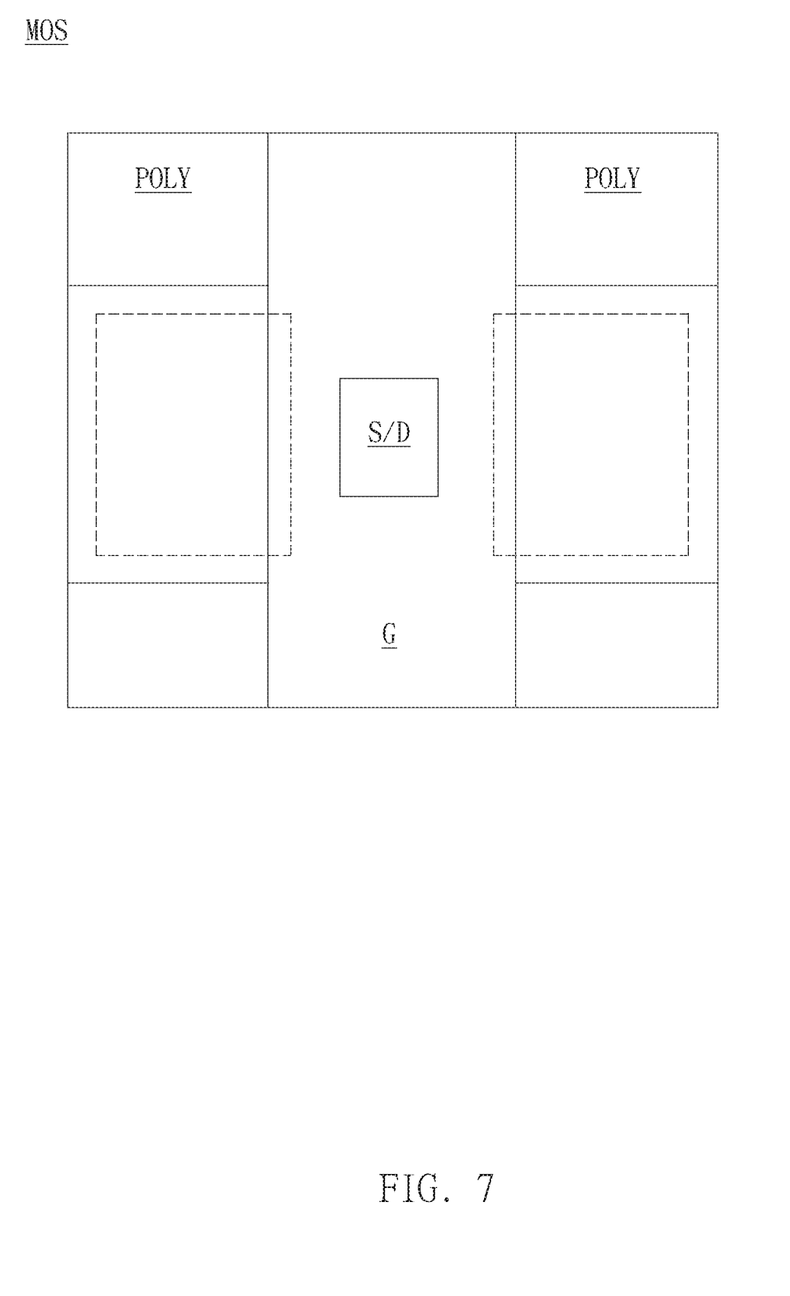
FIG. 7 illustrate a schematic diagram showing that the poly-silicon layer in the MOS capacitor of the invention extends to both sides and the source electrode and the drain electrode are shared with each other.

In the above, in order to increase the capacitance of the second capacitor C2 between the gate electrode G and the oxide layer OX, for example, as shown in FIG. 7, the poly-silicon layer POLY in the MOS capacitor MOS can extend to both sides, so that the area of the poly-silicon layer POLY is larger than the area of the gate electrode G above it, and the source electrode S and the drain electrode D of the MOS capacitor MOS can be shared with each other, so that the MOS capacitor MOS can provide higher capacitance value, but not limited to this.

Figure 8A:
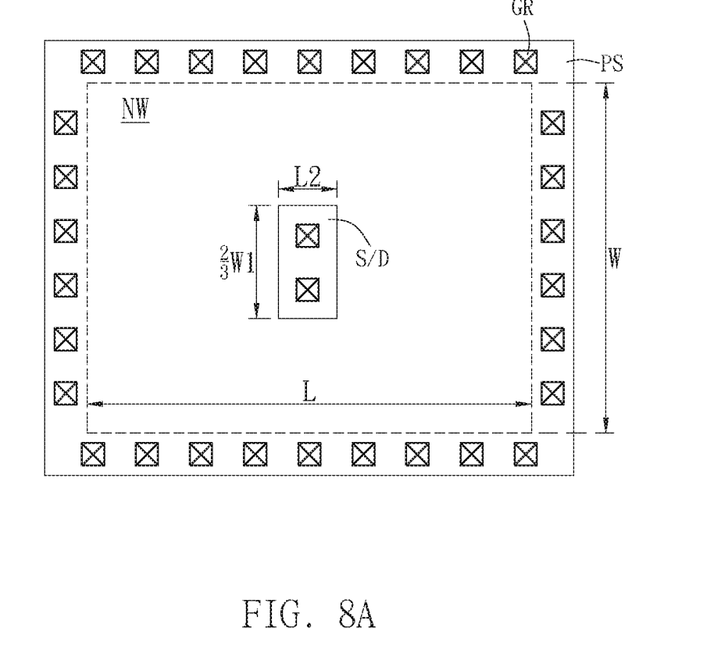
FIG. 8A and FIG. 8B illustrate a top view of the layout of the MOS capacitor and a schematic cross-sectional view of the laminated structure thereof in the invention respectively.
Figure 8B:
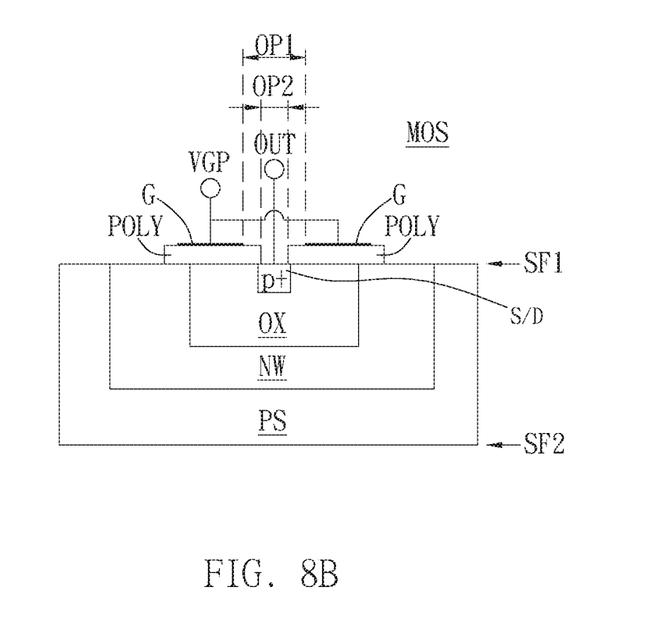

Please refer to FIG. 8A and FIG. 8B. FIG. 8A and FIG. 8B illustrate a top view of the layout of the MOS capacitor and a schematic cross-sectional view of the laminated structure thereof in the invention respectively.

As shown in FIG. 8A, a guard ring GR surrounding the well NW is formed in the substrate PS, and the shared source electrode/drain electrode S/D is disposed at the center.

After comparing FIG. 3A of the prior art with FIG. 8A of the invention, it is known that assuming that the capacitance effective area in FIG. 3A of the prior art is AEFF1 and the capacitance effective area in FIG. 8A of the invention is AEFF2, then AEFF1 and AEFF2 can be calculated as follows:

(1)
$$AEFF1 = L1*W1 \quad \text{Formula 4}$$

(2)
$$AEFF2 = (L*W) - [(2W1/3)*L2] \quad \text{Formula 5}$$
$$= [(L1 + 2L2 + 2L3)*(W1 + 2W2)] - [(2W1/3)*L2]$$

Assuming L1=20, W1=6, L2=1, L3=W2=0.5, it can be known according to Formula 4 and Formula 5 that:

(1) The capacitance effective area AEFF1 in FIG. 3A of the prior art
=20*6=120

(2) The capacitance effective area AEFF2 in FIG. 8A of the invention
=[(20+2*1+2*0.5)*(6+2*0.5)]−(4*1)=157

That is to say, the capacitance effective area AEFF2 in FIG. 8A of the invention can be significantly increased from the capacitance effective area AEFF1 in FIG. 3A of the prior art, and the percentage increase thereof is approximately [(157-120)/120]*100%=30.83%, but not limited to this.

In addition, according to the cross-sectional view of the luminated structure of the MOS capacitor MOS shown in FIG. 8B, the MOS capacitor MOS of the invention can include the substrate PS, the well region NW, the oxide layer OX, the gate electrode G and the shared source electrode/drain electrode S/D.

The substrate PS has a first surface SF1 and a second surface SF2, and the first surface SF1 and the second surface SF2 are opposed to each other. The well NW is formed in the substrate PS. The oxide layer OX is formed in the well NW. The gate electrode G is formed above the first surface SF1 and has a first opening OP1. The shared source electrode/drain electrode S/D is formed in the oxide layer OX near the first surface SF1, and is exposed to the first opening OP1. The gate electrode G is electrically connected to the first contact VGP. The shared source electrode/drain electrode S/D is electrically connected to the second contact OUT.

It should be noted that the substrate PS having the first conductivity type and the shared source electrode/drain electrode S/D both include dopants of the first conductivity type (for example, the P-type dopants). However, since the shared source electrode/drain electrode S/D is a first conductive type heavily-doped region (for example, the P-type heavily-doped region) p+, it is believed that the concentration of the dopants of the first conductivity type in the shared source electrode/drain electrode S/D is higher than that in the substrate PS. As for the well NW having the second conductivity type, it includes dopants of the second conductivity type (for example, the N-type dopants).

In practical applications, as shown in FIG. 8B, the semiconductor device MOS can further include a poly-silicon layer POLY formed above the first surface SF1 and under the gate electrode G, and the poly-silicon layer POLY can extend to both sides to make the area of the poly-silicon layer POLY larger than the area of the gate electrode G. The poly-silicon layer POLY has a second opening OP2, and the second opening OP2 is located below the first opening OP1, and the second opening OP2 is larger than the first opening OP1.

It should be noted that the MOS capacitor MOS shown in FIG. 8B can increase the capacitance effective area and the effective capacitance value by increasing the area of the poly-silicon layer POLY and using the shared source/drain S/D, but not limited to this.

Compared to the prior art, the semiconductor device according to the invention can be a MOS capacitor applied to an operational amplifier, which can increase capacitance effective area and effective capacitance value by increasing the area of the poly-silicon layer and using the shared source/drain electrode under the condition of the same overall area. Therefore, higher compensation capacitance value can be provided to improve the stability of the system, thereby improving the disadvantage of the system which is not stable due to the low actual compensation capacitance value in the prior art.

With the example and explanations above, the features and spirits of the invention will be hopefully well described. Those skilled in the art will readily observe that numerous modifications and alterations of the device may be made while retaining the teaching of the invention. Accordingly, the above disclosure should be construed as limited only by the metes and bounds of the appended claims.

What is claimed is:

1. A semiconductor device for increasing capacitance effective area and effective capacitance value, comprising:
   a substrate having a first surface and a second surface, wherein the first surface and the second surface are opposite to each other;
   a well formed in the substrate, wherein the substrate and the well have a first conductivity type and a second conductivity type respectively;
   an oxidation layer formed in the well;
   a gate electrode formed above the first surface and having a first opening;
   a poly-silicon layer formed above the first surface and under the gate electrode, wherein an area of the poly-silicon layer is larger than an area of the gate electrode; and
   a shared source/drain electrode formed near the first surface in the oxidation layer and exposed from the first opening, wherein the shared source/drain electrode has the first conductivity type;
   wherein a capacitance of a capacitor between the gate electrode and the oxidation layer is proportional to an effective length of the gate electrode which is proportional to a mask length, so the capacitance of the capacitor formed by the gate electrode, the oxidation layer and the substrate is increased by increasing the mask length and extending the poly-silicon layer to both sides to make an area of the poly-silicon layer larger than that of the gate electrode to increase the capacitance effective area and the effective capacitance value without changing manufacturing processes of the semiconductor device.

2. The semiconductor device of claim 1, wherein the first conductivity type is P-type and the second conductivity type is N-type.

3. The semiconductor device of claim 2, wherein a guard ring surrounding the well is formed in the substrate.

4. The semiconductor device of claim 1, further comprising:
   a first contact electrically connected to the gate electrode; and
   a second contact electrically connected to the shared source/drain electrode.

5. The semiconductor device of claim 1, wherein the substrate having the first conductivity type and the shared source/drain electrode both comprise dopants of the first conductivity type.

6. The semiconductor device of claim 5, wherein a concentration of the dopants of the first conductivity type in the shared source/drain electrode is higher than that in the substrate.

7. The semiconductor device of claim 1, wherein the well having the second conductivity type comprises dopants of the second conductivity type.

* * * * *